United States Patent
Liu

(10) Patent No.: US 9,666,496 B2
(45) Date of Patent: *May 30, 2017

(54) SYSTEMS AND METHODS FOR CHEMICAL MECHANICAL PLANARIZATION WITH PHOTOLUMINESCENCE QUENCHING

(71) Applicant: Taiwan Semiconductor Manufacturing Company Limited, Hsinchu (TW)

(72) Inventor: I-Shuo Liu, Hsinchu (TW)

(73) Assignee: Taiwan Semiconductor Manufacturing Company Limited, Hsinchu (TW)

(*) Notice: Subject to any disclaimer, the term of this patent is extended or adjusted under 35 U.S.C. 154(b) by 0 days.

This patent is subject to a terminal disclaimer.

(21) Appl. No.: 14/855,447

(22) Filed: Sep. 16, 2015

(65) Prior Publication Data

US 2016/0005667 A1   Jan. 7, 2016

Related U.S. Application Data

(63) Continuation of application No. 14/097,363, filed on Dec. 5, 2013.

(51) Int. Cl.
| | |
|---|---|
| *H01L 21/304* | (2006.01) |
| *C09G 1/00* | (2006.01) |
| *H01L 21/66* | (2006.01) |
| *H01L 21/306* | (2006.01) |
| *B24B 37/013* | (2012.01) |
| *B24B 49/12* | (2006.01) |
| *H01L 21/67* | (2006.01) |
| *H01L 21/3105* | (2006.01) |

(52) U.S. Cl.
CPC ............ *H01L 22/26* (2013.01); *B24B 37/013* (2013.01); *B24B 49/12* (2013.01); *H01L 21/30625* (2013.01); *H01L 21/31053* (2013.01); *H01L 21/67253* (2013.01); *H01L 22/12* (2013.01)

(58) Field of Classification Search
CPC .............................. H01L 21/304; C09G 1/00
See application file for complete search history.

(56) References Cited

U.S. PATENT DOCUMENTS

| | | | | |
|---|---|---|---|---|
| 6,939,198 | B1* | 9/2005 | Swedek | B24B 37/013 451/41 |
| 9,153,452 | B2* | 10/2015 | Liu | H01L 22/26 |
| 9,165,778 | B2* | 10/2015 | Liu | H01L 21/30625 |
| 2003/0022502 | A1* | 1/2003 | Matsui | C09G 1/02 438/692 |

(Continued)

OTHER PUBLICATIONS

Gratzel, Michael; Dye-sensitized Solar Cells; Journal of Photochemistry and Photobiology, 4; pp. 145-153; 2003.

(Continued)

*Primary Examiner* — Mohammad Choudhry
(74) *Attorney, Agent, or Firm* — Jones Day

(57) ABSTRACT

A method includes performing a chemical-mechanical planarization (CMP) on an article, providing a polishing fluid including luminescent particles capable of generating a fluorescent light in response to a light incident on the article, and detecting an intensity of the fluorescent light. An apparatus that is capable of performing the method and a system that includes the apparatus are also disclosed.

18 Claims, 6 Drawing Sheets

(56) References Cited

U.S. PATENT DOCUMENTS

2006/0079007 A1* 4/2006 Zutshi .................. B24B 37/013
                                                                                                    438/7

OTHER PUBLICATIONS

Lin, Yu-Ting, Zeng, Tsung-Wei, Lai, Wei-Zong, Chen, Chun-Wei, Lin, Yun-Yue, Chang, Yu-Sheng, Su, Wei-Fang; Efficient Photoinduced Charge Transfer in TiO2 Nanorod/Conjugated Polymer Hybrid Materials; Institute of Physics Publishing, Nanotechnology, 17; pp. 5781-5785; 2006.

Liu, I-Shuo, Lo, Hsi-Hsing, Chien, Chih-Tao, Lin, Yun-Yue, Chen, Chun-Wei, Chen, Yang-Fang, Su, Wei-Fang, Liou, Sz-Chian; Enhancing Photoluminescence Quenching and Photoelectric Properties of CdSe Quantum Dots with Hole Accepting Ligands; Journal of Materials Chemistry, 18; pp. 675-682; 2008.

Liu, I-Shuo et al.; U.S. Appl. No. 14/083,818 Specification: Systems and Methods for Chemical Mechanical Planarization with Fluorescence Detection, filed Nov. 19, 2013.

Liu, I-Shuo et al.; U.S. Appl. No. 14/083,818 Drawings: Systems and Methods for Chemical Mechanical Planarization with Fluorescence Detection, filed Nov. 19, 2013.

Robel, Istvan, Subramanian, Vaidyanathan, Kuno, Masaru, Kamat, Prashant; Quantum Dot Solar Cells: Harvesting Light Energy with CdSe Nanocrystals Molecularly Linked to Mesoscopic TiO2 Films; Journal of the American Chemical Society, 128(7); pp. 2385-2393; 2006.

* cited by examiner

US 9,666,496 B2

SYSTEMS AND METHODS FOR CHEMICAL MECHANICAL PLANARIZATION WITH PHOTOLUMINESCENCE QUENCHING

CROSS-REFERENCE TO A RELATED APPLICATION

This application is a continuation application of U.S. patent application Ser. No. 14/097,363, filed Dec. 5, 2013, which is incorporated herein by reference in its entirety.

FIELD

The technology described in this disclosure relates generally to material processing and more particularly to planarization.

BACKGROUND

Chemical-mechanical polishing/planarization (CMP) is often implemented in semiconductor devices fabrication. A CMP process can be used for planarizing surfaces of a wafer with a combination of chemical and mechanical forces. Mechanical grinding alone may cause surface damages, while wet etching alone cannot attain good planarization. The CMP process involves both the mechanical grinding and the wet etching to generate a smooth surface on a wafer, and prepare the wafer for subsequent processes (e.g., photolithography) in the fabrication of semiconductor devices.

SUMMARY

In accordance with one aspect of the teachings described herein, an apparatus configured to perform a chemical-mechanical planarization (CMP) on an article comprises a polishing head and a fluorescence detector. The polishing head is configured to hold the article. The fluorescence detector is configured to detect an intensity of a fluorescent light generated in response to a light incident on the article.

In accordance with another aspect of the teachings described herein, a system configured to perform a chemical-mechanical planarization (CMP) on an article comprises a polishing head, a polishing fluid, and a fluorescence detector. The polishing head is configured to hold an article. The polishing fluid includes luminescent particles capable of generating a fluorescent light in response to a light incident on the article. The fluorescence detector is configured to detect an intensity of the fluorescent light.

In accordance with yet another aspect of the teachings described herein, a method comprises performing a chemical-mechanical planarization (CMP) on an article, providing a polishing fluid including luminescent particles capable of generating a fluorescent light in response to a light incident on the article, and detecting an intensity of the fluorescent light.

DETAILED DESCRIPTION

In semiconductor device fabrication, usually a thin material layer (e.g., titanium nitride, titanium oxide) is used as a CMP stop layer for a CMP process and/or an etching hard mask for an etching process that follows the CMP process. Oftentimes, it is hard to control the CMP process with accuracy when the CMP process is to be stopped. The CMP process is usually supposed to stop when material layers on top of the CMP stop layer are removed and the CMP stop layer (e.g., titanium nitride, titanium oxide) is exposed. If the CMP process is not stopped in time, the thin CMP stop layer may be removed and it cannot serve as the etching hard mask. Material layers under the CMP stop layer cannot be protected during the subsequent etching process.

Figure 1A:
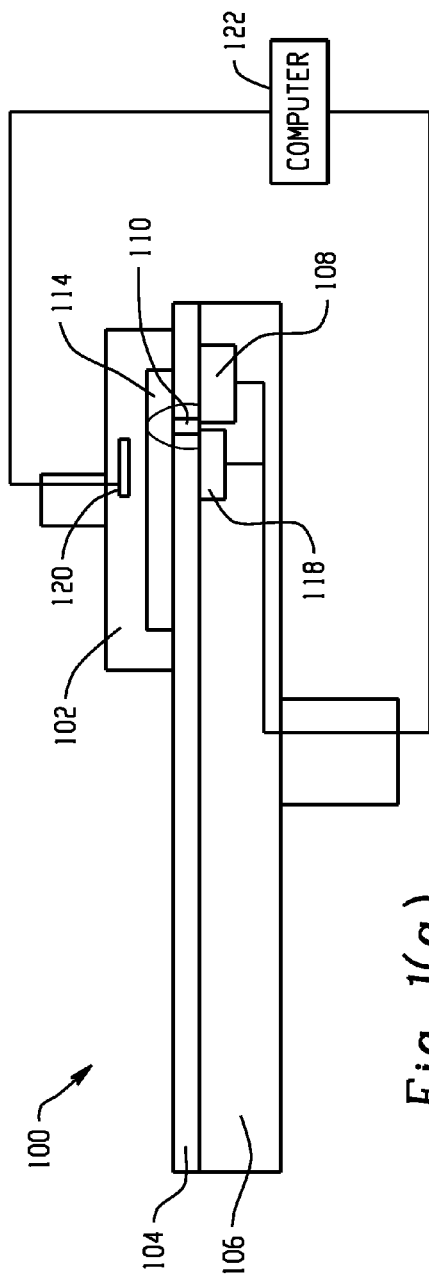
FIG. 1(a)-FIG. 1(b) depict an example diagram showing a CMP system.
Figure 1B:
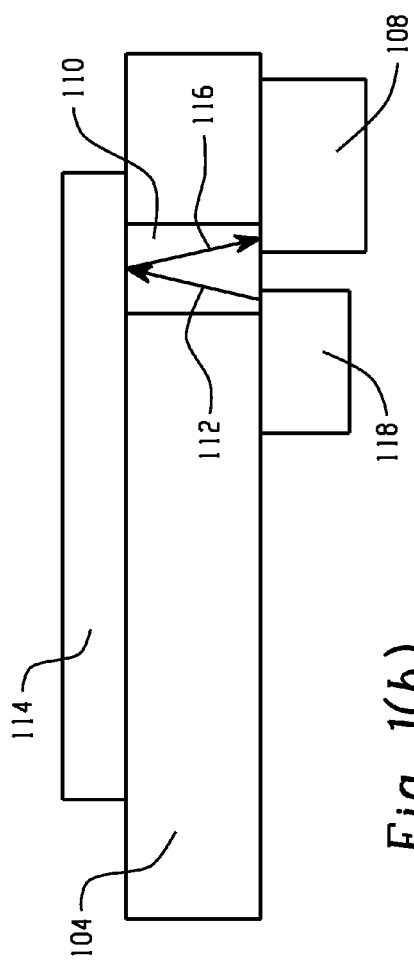

FIG. 1(a)-FIG. 1(b) depict an example diagram showing a CMP system. The CMP system 100 is configured to perform a CMP process with fluorescence detection so that the CMP process stops with accuracy when a CMP stop layer (e.g., nitrides) is exposed.

As shown in FIG. 1(a) and FIG. 1(b), the CMP system 100 includes a polishing head 102, a polishing pad 104, a platen 106, and a fluorescence detector 108. A polishing fluid (not shown) used for the CMP process includes luminescent particles that are capable of generating a fluorescent light 116 in response to an incident light 112 (e.g., from a light source 118) and transferring charges (e.g., electrons or holes) to a CMP stop layer included in a wafer 114. One or more small windows 110 in the polishing pad 104 allows the incident light 112 to pass through and fall on the wafer 114 that includes the CMP stop layer (e.g., a nitride layer), and allows the fluorescent light 116 to pass through to the fluorescence detector 108. The intensity of the fluorescent light 116 is changed when the CMP stop layer is exposed during the CMP process. The fluorescence detector 108 is configured to detect the change of the intensity of the fluorescent light 116 so as to stop the CMP process when the CMP stop layer is exposed after material layers on top of the CMP stop layer are removed.

For example, the windows 110 are fabricated using one or more materials that are approximately transparent to the incident light 112 and the fluorescent light 116. In some embodiments, a first window is used to allow the incident light 112 to pass through, and a second window is used to allow the fluorescent light 116 to pass through. The two windows are fabricated with different materials which are approximately transparent to the incident light 112 and the fluorescent light 116 respectively.

The CMP system 100 further includes a polish-head-rotation controller 120 and a computer 122. For example, the polish-head-rotation controller 120 is configured to control the polishing head 102 to rotate and oscillate to bring the wafer 114 into contact with the polishing pad 104 that moves in the plane of the wafer surface to be planarized (e.g., together with the platen 106). The computer 122 is configured to control the light source 118 and/or the fluorescence detector 108. As an example, the computer 122 compares the detected intensity of the fluorescent light 116 with a predetermined threshold, and causes the polish-head-rotation controller 120 to stop the polishing head 102 if the detected intensity of the fluorescent light 116 is smaller than the predetermined threshold. In certain embodiments, the polishing pad 104 is made of stacks of soft and hard materials (e.g., porous polymeric materials).

Figure 2A:
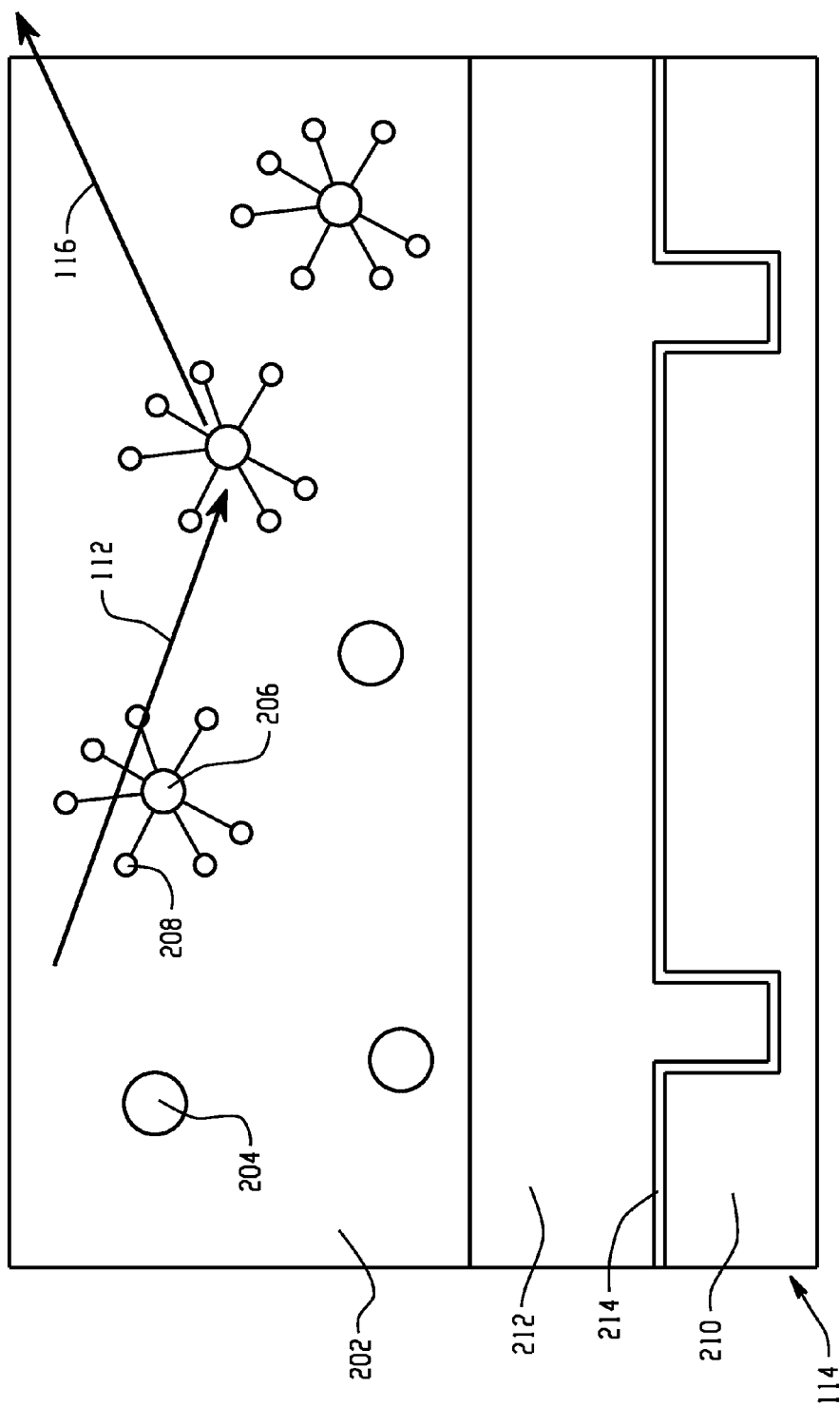
FIG. 2(a) and FIG. 2(b) depict an example diagram showing a polishing fluid including luminescent particles used in the CMP system as shown in FIG. 1(a) and FIG. 1(b).
Figure 2B:
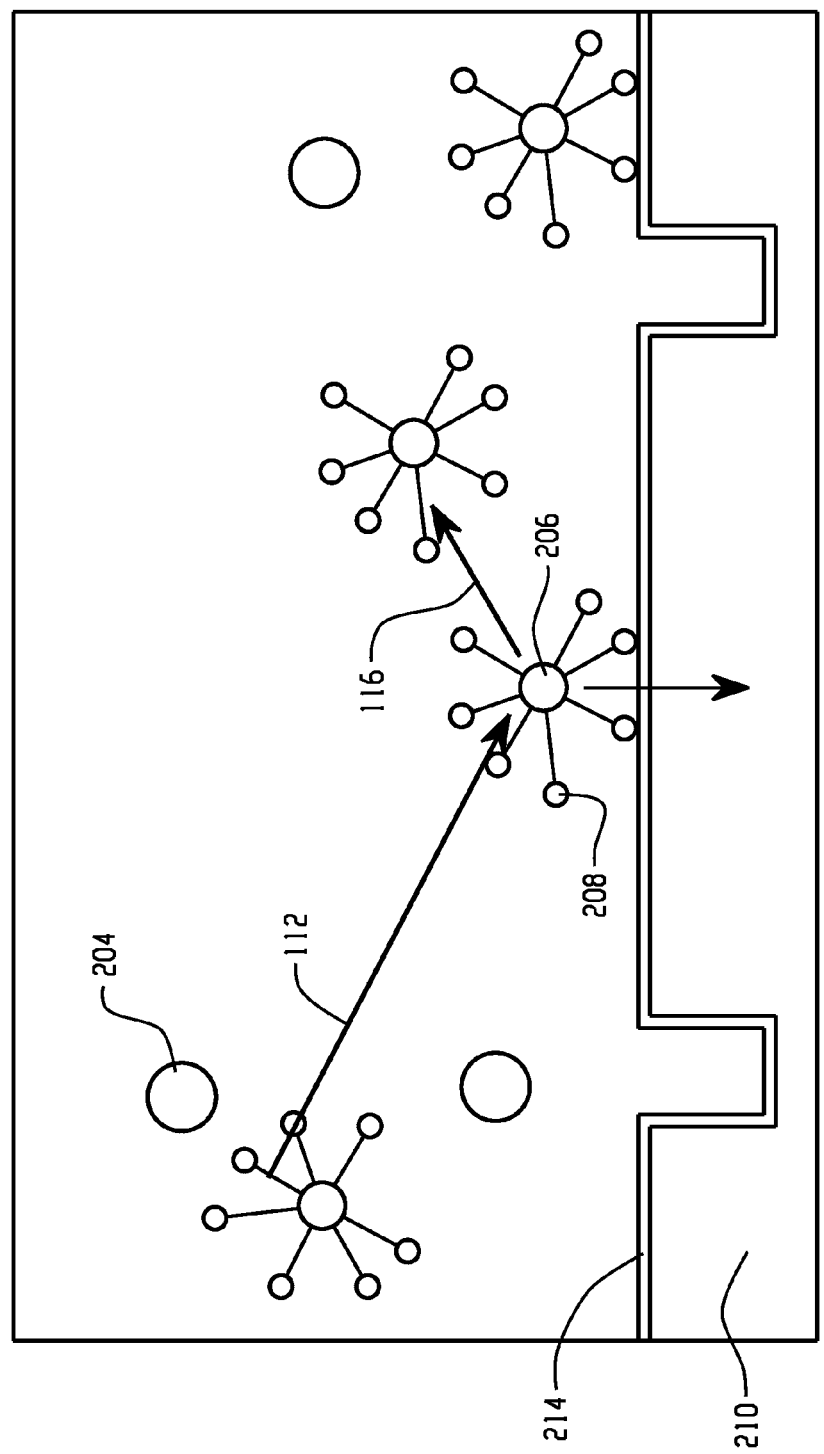

FIG. 2(a) and FIG. 2(b) depict an example diagram showing a polishing fluid including luminescent particles used in the CMP system 100. The polishing fluid 202 includes an abrasive and corrosive chemical slurry (e.g., a colloid). For example, the polishing fluid 202 includes one or more abrasive materials 204, and a plurality of luminescent particles 206 capable of generating the fluorescent light 116 in response to the incident light 112. The luminescent particles 206 each include one or more surfactant particles 208 capable of attaching to a CMP stop layer 214 included in the wafer 114. The wafer 114 includes multiple layers on a substrate 210. One or more material layers 212 (e.g., silicon oxide) are formed on the CMP stop layer 214. For example, the CMP stop layer 214 includes a nitride layer (e.g., titanium oxide, titanium nitride) and does not generate a fluorescent light in response to the incident light 112.

At the beginning of the CMP process, the surfactant particles 208 are attached to the luminescent particles 206 and the fluorescent light 116 has a high intensity. As the CMP process continues, the material layers 212 formed on the CMP stop layer 214 are removed, and at least part of the CMP stop layer 214 is exposed. The surfactant particles 208 begin to attach to the CMP stop layer 214, as shown in FIG. 2(b). Charges (e.g., electrons or holes) are transferred from the luminescent particles 206 to the CMP stop layer 214. In response, the intensity of the fluorescent light 116 begins to decrease. The fluorescence detector 108 detects such changes in the intensity of the fluorescent light 116, and the CMP process is stopped when the intensity of the fluorescent light 116 drops below a threshold. For example, the luminescent particles 206 include CdS, CdSe, CdTe, ZnO, ZnS, ZnSe, ZnTe, InAs, InN, InP, GaN, GaP, GaAs, AlP, or other suitable materials. The abrasive materials 204 include silica or other suitable materials. The surfactant particles 208 include organic molecules that contain one or more hydroxyl-based (e.g., —OH) functional groups, one or more carboxyl-based (e.g., —COOH) functional groups, one or more ammonium-ion-based (e.g., —NH$^+$) functional groups, one or more sulfonic-acid-based (e.g., —SO$_3$H) functional groups, or other suitable functional groups.

Figure 3A:
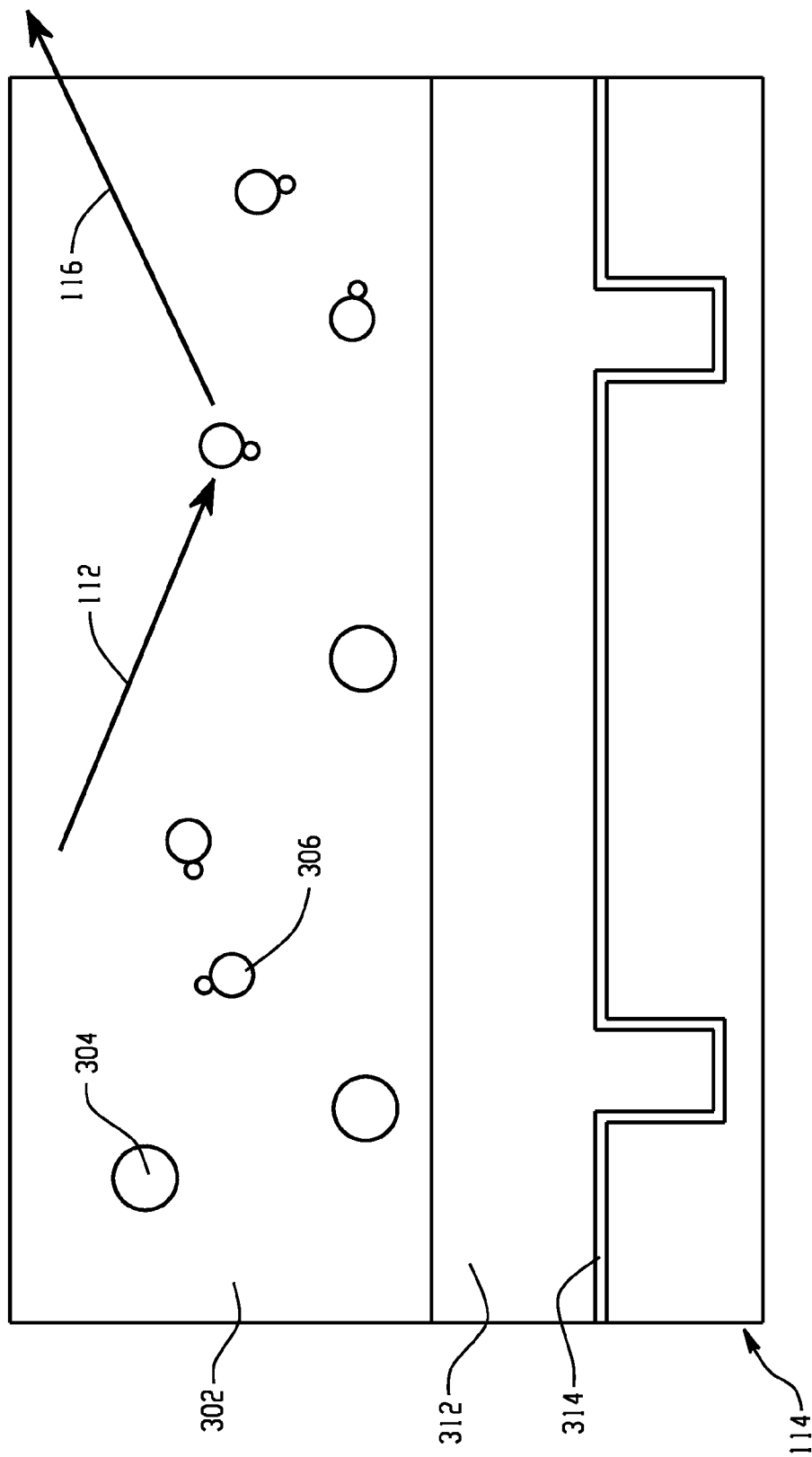
FIG. 3(a) and FIG. 3(b) depict another example diagram showing a polishing fluid including luminescent particles used in the CMP system as shown in FIG. 1(a) and FIG. 1(b).
Figure 3B:
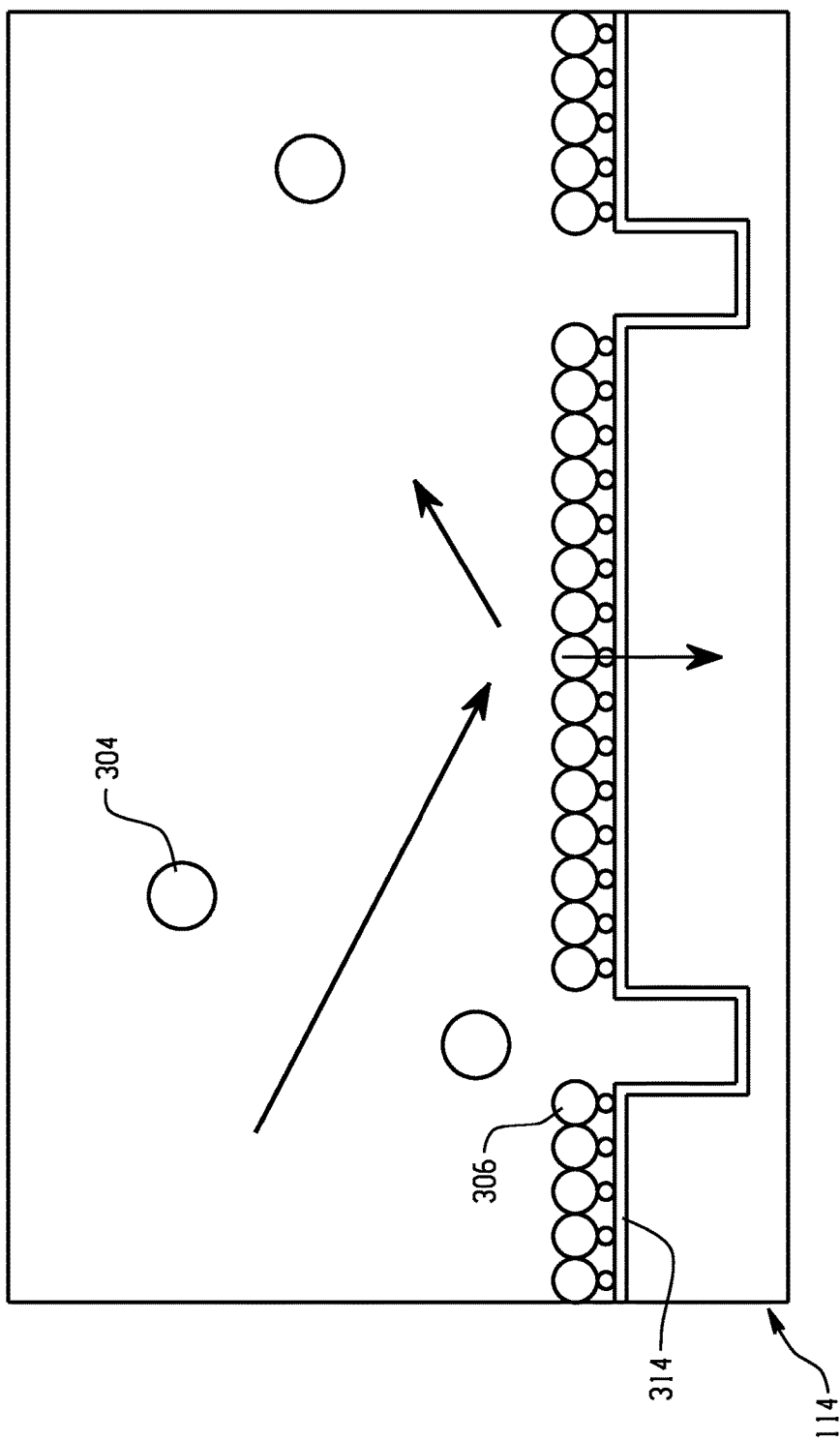

FIG. 3(a) and FIG. 3(b) depict another example diagram showing a polishing fluid including luminescent particles used in the CMP system 100. The polishing fluid 302 includes one or more abrasive materials 304, and a plurality of luminescent particles 306 capable of generating the fluorescent light 116 in response to the incident light 112 and attaching to a CMP stop layer 314 (e.g., titanium oxide, titanium nitride) included in the wafer 114. In some embodiments, one or more material layers 312 (e.g., silicon oxide) are formed on the CMP stop layer 314.

During the CMP process, the material layers 312 formed on the CMP stop layer 314 are removed, and at least part of the CMP stop layer 314 is exposed. The luminescent particles 306 begin to attach to the CMP stop layer 314, as shown in FIG. 3(b). Charges (e.g., electrons or holes) are transferred from the luminescent particles 306 to the CMP stop layer 314. In response, the intensity of the fluorescent light 116 begins to decrease. When most of the luminescent particles 306 attach to the surface of the CMP stop layer 314, the intensity of the fluorescent light 116 is very low. The fluorescence detector 108 detects such changes in the intensity of the fluorescent light 116, and the CMP process is stopped when the intensity of the fluorescent light 116 drops below a threshold. For example, the luminescent particles 306 include certain dye materials, such as EBFP, Azunite, GFPuv, and T-sapphire. In another example, the luminescent particles 306 include certain fluorescence conducting polymer materials, such as MEHPPV and P3HT. The luminescent particles 306 include organic molecules that contain one or more hydroxyl-based (e.g., —OH) functional groups, one or more carboxyl-based (e.g., —COOH) functional groups, one or more ammonium-ion-based (e.g., —NH$^+$) functional groups, one or more sulfonic-acid-based (e.g., —SO$_3$H) functional groups, or other suitable functional groups. The abrasive materials 304 include silica or other suitable materials.

Figure 4:
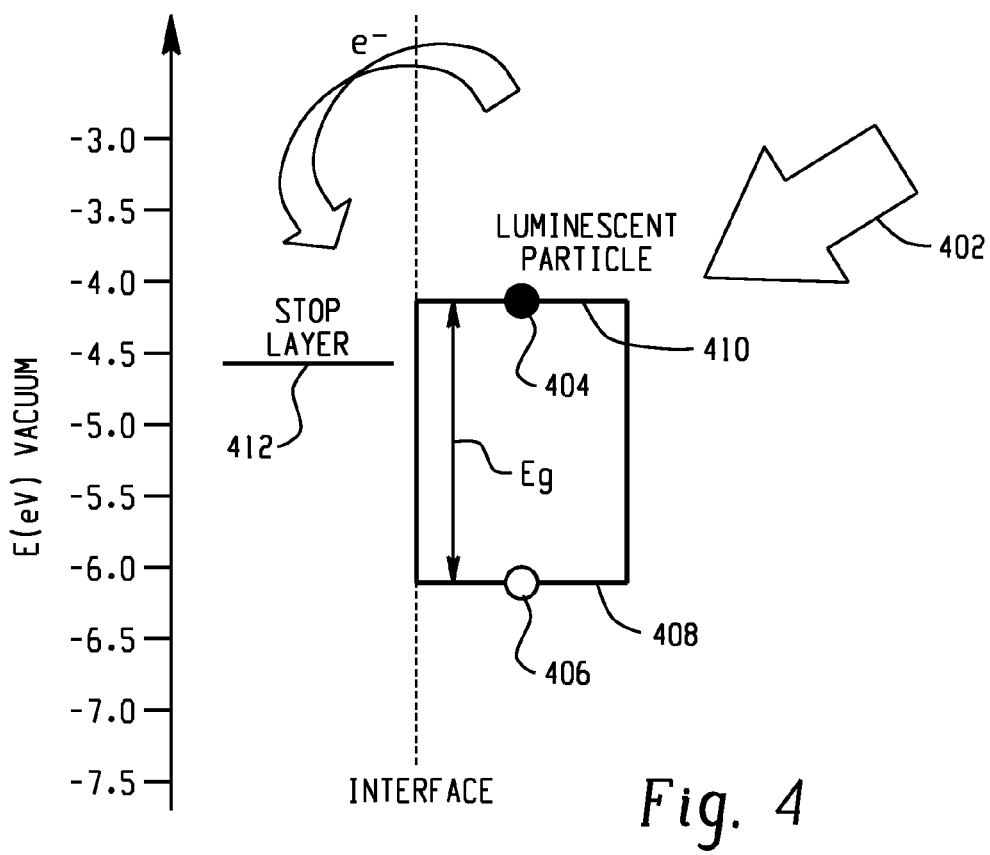
FIG. 4 depicts an example band diagram showing electrons being transferred from a luminescent particle to a CMP stop layer.

FIG. 4 depicts an example band diagram showing electrons being transferred from a luminescent particle to a CMP stop layer. As shown in FIG. 4, a luminescent particle is in contact with a CMP stop layer. In response to an incident light 402, one or more electrons 404 of the luminescent particle are excited from a first energy level 408 to a second energy level 410, leaving behind one or more holes 406 at the first energy level 408. The second energy level 410 is higher than an energy level 412 corresponding to a conduction band of the CMP stop layer, and the one or more electrons 404 flow from the luminescent particle to the CMP stop layer. In some embodiments, the energy of the incident light is larger than a difference between the first energy level 408 and the second energy level 410 which corresponds to a band gap of the luminescent particle (e.g., Eg). For example, the first energy level 408 is at about −6.0 eV, and the second energy level 410 is at about −4.0 eV. The energy level 412 of the CMP stop layer is at about −4.5 eV.

Figure 5:
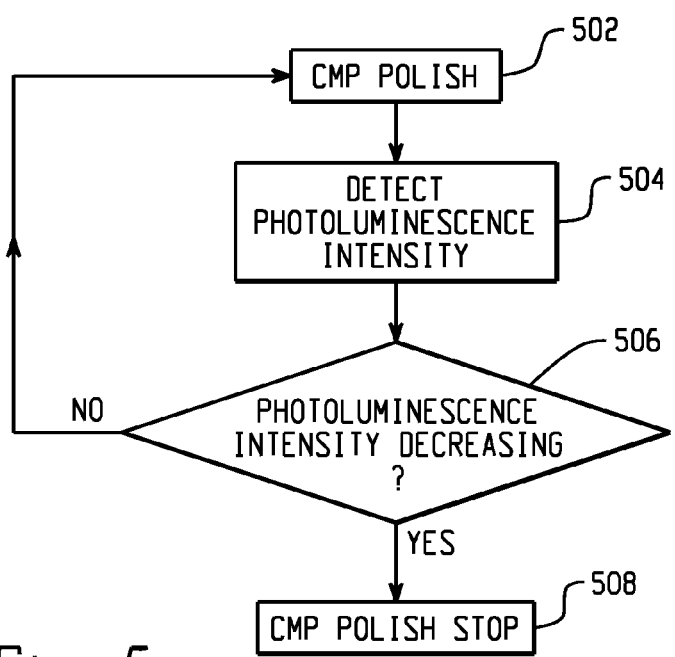
FIG. 5 depicts an example flow chart for performing CMP on an article.

FIG. 5 depicts an example flow chart for performing CMP on an article. At 502, the CMP process begins on an article (e.g., a wafer) including a CMP stop layer. A polishing fluid that is used for the CMP process includes a plurality of luminescent particles capable of generating a fluorescent light in response to an incident light and attaching to the CMP stop layer included in the article. Once the luminescent particles attach to the CMP stop layer, electric charges (e.g., electrons, holes) transfer from the luminescent particles to the CMP stop layer and as a result an intensity of the fluorescent light decreases. At 504, the intensity of the fluorescent light is detected. At 506, a determination whether the intensity of the fluorescent light is decreasing (e.g., becoming smaller than a threshold) is made. If the intensity of the fluorescent light is decreasing (e.g., becoming smaller than a threshold), it indicates that at least a large part of the CMP stop layer is exposed. The CMP process ends to avoid removing the CMP stop layer, at 508. Otherwise, the CMP process continues.

For example, the luminescent particles include CdS, CdSe, CdTe, ZnO, ZnS, ZnSe, ZnTe, InAs, InN, InP, GaN, GaP, GaAs, AlP, EBFP, Azunite, GFPuv, T-sapphire, MEHPPV, P3HT, or other suitable materials. In some embodiments, the luminescent particles include surfactant particles capable of attaching to the stop layer. As an example, the surfactant particles include organic molecules that contain one or more hydroxyl-based functional groups, one or more carboxyl-based functional groups, one or more ammonium-ion-based functional groups, one or more sulfonic-acid-based functional groups, or other suitable functional groups.

This written description uses examples to disclose embodiments of the disclosure, include the best mode, and also to enable a person of ordinary skill in the art to make and use various embodiments of the disclosure. The patentable scope of the disclosure may include other examples that occur to those of ordinary skill in the art. One of ordinary skill in the relevant art will recognize that the various embodiments may be practiced without one or more of the specific details, or with other replacement and/or additional methods, materials, or components. Further, persons of ordinary skill in the art will recognize various equivalent combinations and substitutions for various components shown in the figures.

Well-known structures, materials, or operations may not be shown or described in detail to avoid obscuring aspects of various embodiments of the disclosure. Various embodiments shown in the figures are illustrative example representations and are not necessarily drawn to scale. Particular features, structures, materials, or characteristics may be combined in any suitable manner in one or more embodiments. The present disclosure may repeat reference numerals and/or letters in the various examples, and this repetition is for the purpose of simplicity and clarity and does not in itself dictate a relationship between the various embodiments and/or configurations discussed. Various additional layers and/or structures may be included and/or described features may be omitted in other embodiments. For example, a particular layer described herein may include multiple components which are not necessarily connected physically or electrically. Various operations may be described as multiple discrete operations in turn, in a manner that is most helpful in understanding the disclosure. However, the order of description should not be construed as to imply that these operations are necessarily order dependent. In particular, these operations need not be performed in the order of presentation. Operations described herein may be performed in a different order, in series or in parallel, than the described embodiments. Various additional operations may be performed and/or described. Operations may be omitted in additional embodiments.

This written description and the following claims may include terms, such as top, on, under, etc. that are used for descriptive purposes only and are not to be construed as limiting. The embodiments of a device or article described herein can be manufactured, used, or shipped in a number of positions and orientations. For example, terms designating relative vertical position may refer to a situation where a device side (or active surface) of a substrate or integrated circuit is the "top" surface of that substrate; the substrate may actually be in any orientation so that a "top" side of a substrate may be lower than the "bottom" side in a standard terrestrial frame of reference and may still fall within the meaning of the term "top." The term "on" as used herein (including in the claims) may not necessarily indicate that a first layer/structure "on" a second layer/structure is directly on or over and in immediate contact with the second layer/structure unless such is specifically stated; there may be one or more third layers/structures between the first layer/structure and the second layer/structure. The term "under" as used herein (including in the claims) may not indicate that a first layer/structure "under" a second layer/structure is directly under and in immediate contact with the second layer/structure unless such is specifically stated; there may be one or more third layers/structures between the first layer/structure and the second layer/structure. The term "substrate" used herein (including in the claims) may refer to any construction comprising one or more semiconductive materials, including, but not limited to, bulk semiconductive materials such as a semiconductive wafer (either alone or in assemblies comprising other materials thereon), and semiconductive material layers (either alone or in assemblies comprising other materials).

What is claimed is:

1. An apparatus for performing a chemical-mechanical planarization (CMP) on an article using a polishing fluid that includes particles, the apparatus comprising:
    a polishing head configured to hold and to move the article;
    a fluorescence detector configured to detect an intensity of a fluorescent light generated by the particles in response to a light incident on the article, based on which the CMP is controlled;
    a polish-head-rotation controller coupled to the polishing head and operable so as to control the operation of the polishing head; and
    a computer coupled to the fluorescence detector and the polish-head-rotation controller and configured to compare the intensity of the fluorescent light detected by the fluorescence detector with a threshold and to control the operation of the polish-head-rotation controller based on the result of the comparison.

2. The apparatus of claim 1, further comprising a polishing pad disposed between the polishing head and the fluorescence detector and having a window through which the fluorescence detector detects the intensity of the fluorescent light.

3. The apparatus of claim 1, further comprising, when the intensity of the fluorescent light detected by the fluorescence detector is determined to be smaller than the threshold, the computer causes the polish-head-rotation controller to stop the operation of the polishing head.

4. The apparatus of claim 1, further comprising a light source configured to emit the light incident on the article.

5. The apparatus of claim 4, further comprising a polishing pad disposed between the light source and the polishing head and having a window through which the light source emits the light incident on the article.

6. A system for performing a chemical-mechanical planarization (CMP) on an article, the system comprising:
    a polishing head configured to hold and to move the article;
    a polishing fluid including luminescent particles capable of generating a fluorescent light in response to a light incident on the article;
    a fluorescence detector configured to detect an intensity of the fluorescent light;
    a polish-head-rotation controller coupled to and operable so as to control the operation of the polishing head; and
    a computer coupled to the fluorescence detector and the polish-head-rotation controller and configured to compare the intensity of the fluorescent light detected by the fluorescence detector with a threshold and to control the operation of the polish-head-rotation controller based on the result of the comparison.

7. The system of claim 6, wherein the luminescent particles include surfactant particles.

8. The system of claim 6, wherein the luminescent particles include holes at a first energy level and electrons at a second energy level higher than the first energy level.

9. The system of claim 8, further comprising the article, wherein the article has a CMP stop layer that has an energy level lower than the second energy level.

10. The system of claim 8, further comprising a light source configured to emit the light incident on the article, wherein the light incident on the article has an energy level larger than a difference between the first energy level and the second energy level.

11. The system of claim 10, further comprising a polishing pad above which the polishing head is disposed and below which the fluorescence detector and the light source are disposed, and including a window made from a material approximately transparent to the fluorescent light and the incident light.

12. The system of claim 6, further comprising the article, wherein the article has a CMP stop layer that includes one of titanium oxide and titanium nitride.

13. A method comprising:
performing a chemical-mechanical planarization (CMP) on an article;
providing a polishing fluid including luminescent particles that generates a fluorescent light in response to a light incident on the article;
detecting an intensity of the fluorescent light; and
controlling the CMP based on the detected fluorescent light intensity, wherein the controlling the CMP includes:
comparing the detected fluorescent light intensity with a threshold, and
controlling the CMP based on the result of the comparison.

14. The method of claim 13, wherein the performing a CMP on the article exposes a CMP stop layer of the article, the method further comprising attaching the luminescent particles to the CMP stop layer of the article.

15. The method of claim 14, further comprising emitting the light incident on the article, wherein the emitting the light incident on the article excites electrons of the luminescent particles from a first energy level to a second energy level higher than the first energy level and leaves holes of the luminescent particles at the first energy level.

16. The method of claim 15, wherein the second energy level is higher than an energy level of the CMP stop layer of the article.

17. The method of claim 15, wherein the light incident on the article has an energy level larger than a difference between the first energy level and the second energy level.

18. The method of claim 13, wherein the controlling the CMP further includes, when the detected fluorescent light intensity is determined to be smaller than the threshold, stopping the CMP.

* * * * *